US 7,983,498 B1

(12) United States Patent
Donovan (10) Patent No.: US 7,983,498 B1
(45) Date of Patent: Jul. 19, 2011

(54) LOW DYNAMIC RANGE 3-CHANNEL COLOR COMPRESSION

(75) Inventor: Walter E. Donovan, Saratoga, CA (US)

(73) Assignee: NVIDIA Corporation, Santa Clara, CA (US)

( * ) Notice: Subject to any disclaimer, the term of this patent is extended or adjusted under 35 U.S.C. 154(b) by 1016 days.

(21) Appl. No.: 11/834,624

(22) Filed: Aug. 6, 2007

(51) Int. Cl.
*G06K 9/46* (2006.01)

(52) U.S. Cl. .......................................... 382/235; 375/240

(58) Field of Classification Search ................... 382/232, 382/235; 375/240
See application file for complete search history.

(56) References Cited

U.S. PATENT DOCUMENTS

| | | | |
|---|---|---|---|
| 4,626,829 A | 12/1986 | Hauck | |
| 4,890,249 A | 12/1989 | Yen | |
| 4,893,187 A | 1/1990 | Tsujimoto et al. | |
| 4,947,249 A * | 8/1990 | Kondo | 375/240.12 |
| 5,166,987 A * | 11/1992 | Kageyama | 382/250 |
| 6,687,304 B1 * | 2/2004 | Peng | 375/240.24 |
| 6,721,003 B1 * | 4/2004 | Tsuruoka et al. | 348/240.2 |
| 6,895,052 B2 | 5/2005 | Hanamura et al. | |
| 7,095,783 B1 | 8/2006 | Sotheran et al. | |
| 2008/0002895 A1 | 1/2008 | Flavell et al. | |
| 2008/0055331 A1 | 3/2008 | Lourcha et al. | |

OTHER PUBLICATIONS

Notice of Allowance, U.S. Appl. No. 11/614,039, dated Feb. 4, 2010.
Roimela et al., "High Dynamic Range Texture Compression," ACM Transactions on Graphics, vol. 25, No. 3, pp. 698-706, Jul. 2008.
Munkberg et al., "High Dynamic Range Texture Compression for Graphics Hardware," Association for Computing Machinery, Inc. pp. 698-706, Jul. 2006.
Ström et al., iPACKMAN: "High-Quality, Low-Complexity Texture Compression for Mobile Phones," ACM Press, pp. 63-70, '05 Graphics Hardware 2005 (Co-located with SIGGRAPH 2005 Conference) Los Angeles, CA, USA-Jul. 30-31, 2005.

* cited by examiner

*Primary Examiner* — Vikkram Bali
*Assistant Examiner* — Eueng-Nan Yeh
(74) *Attorney, Agent, or Firm* — Patterson & Sheridan, LLP.

(57) ABSTRACT

Systems and methods for representing low dynamic range data in compressed formats with a fixed size block allow low dynamic range data to be stored in less memory. The compressed formats use 8 bits per pixel to represent 24 bits of low dynamic range data for each pixel. The compressed format includes four or six endpoint values, a partition index that specifies a mask for each pair of the endpoint values, and an index for each pixel in the block. The indices are compressed to allow more bits for the endpoint values. Mode bits are included to distinguish between the different encodings and various blocks within a single compressed image may be encoded differently. Compressed low dynamic range values may be efficiently decompressed in hardware.

19 Claims, 11 Drawing Sheets

| Compressed Indices 160 | Compressed Endpoints 155 | Partition 152 | Mode 150 |

LOW DYNAMIC RANGE 3-CHANNEL COLOR COMPRESSION

BACKGROUND OF THE INVENTION

1. Field of the Invention

Embodiments of the present invention generally relate to data compression and decompression and, more specifically, to compression and decompression of low dynamic range pixel data.

2. Description of the Related Art

Conventional compression formats for low dynamic range data for pictures including 3 channels (RGB, i.e., red, green, blue) that are each represented by an 8 bit value, such as the DXT1 compressed texture format used by DirectX8 and its successors, work reasonably well, but generally exhibit visible artifacts when decompressed.

Accordingly, there is a need for a data compression format for these low dynamic range pictures that does not exhibit visible artifacts. Furthermore, it is desirable to be able to decompress the compressed low dynamic range values in hardware in order to process the low dynamic range values as texture data.

SUMMARY OF THE INVENTION

The current invention involves new systems and methods for compressing and decompressing low dynamic range data that is represented in a compressed format. The compressed formats use 8 bits per pixel to represent 24 bits of low dynamic range data for each pixel within a fixed size block using a 3:1 compression ratio. The compressed format includes four or six endpoint values, a partition index that specifies a mask for each pair of the endpoint values, and an index for each pixel in the block. The indices are compressed to allow more bits for the endpoint values. Mode bits are included to distinguish between the different encodings and various blocks within a single compressed image may be encoded differently. Compressed low dynamic range values may be efficiently decompressed in hardware.

Various embodiments of a compressed data format of the invention representing low dynamic range data are embodied in a computer-readable medium. The compressed data format includes mode bits in a first field of variable length, a second field of variable length, a compressed endpoint field of variable length, and an index field of variable length. The first field includes mode bits that indicate whether the compressed data format specifies that the low dynamic range data is encoded using a four point transform or a six point transform. The second field includes a partition index that specifies a partition mask indicating a pair of decompressed endpoints that is used to compute a decompressed low dynamic range values for each channel of each pixel. The compressed endpoint field includes four compressed endpoints or six compressed endpoints. The index field includes compressed indices that each correspond to a single pixel within a fixed size block of low dynamic range data, wherein each compressed index is used to compute a decompressed low dynamic range value for one channel of a single pixel.

Various embodiments of a method of the invention for compressing low dynamic range values into a compressed format include determining a variable length mode, determining a partition index, determining a first reference endpoint and remaining endpoints, compressing the remaining endpoints, compressing indices, and encoding the variable length mode, the partition index, the compressed indices, the first reference endpoint, and the compressed endpoints to produce the low dynamic range data in the compressed format. The partition index specifies a partitioning of pixels in a fixed size block of low dynamic range data. The first reference endpoint and remaining endpoints produce an endpoint pair for each partition of the fixed size block. The variable length mode indicates a number of bits used to represent each endpoint and a number of partitions. The compressed indices correspond to the pixels within the fixed size block of low dynamic range data and each compressed index specifies a low dynamic range value for one channel of a single pixel.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Low dynamic range data is represented in compressed formats with a compression size of 8 bpp. 4×4 pixel blocks are compressed into 128 bits that include four or six compressed endpoint values with three channels and an index for each pixel in the block. Other embodiments of the present invention may include fewer or more pixels in an N×M dimension block, where N and M are each integers. Each pixel may include up to three channels of data, e.g., red, green, blue, alpha, depth, or the like. Because a fixed size block of data is compressed into a fixed length format, it is possible to determine the location of each particular block of data, permitting random access of the compressed data.

Figure 1A:
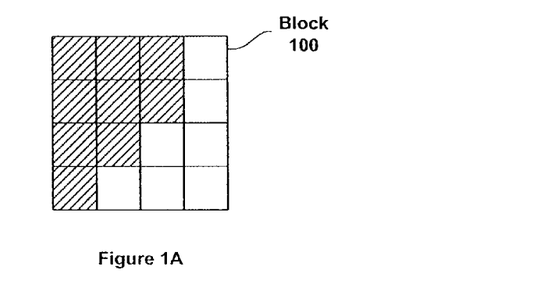
FIG. 1A illustrates a two partition distribution of a fixed size block of pixels in accordance with one or more aspects of the present invention.

FIG. 1A illustrates a two partition distribution of a fixed size block 100 of pixels, in accordance with one or more aspects of the present invention. The pixels within block 100 are distributed into two different regions, where each region is represented with a different pattern. Each region corresponds to one endpoint pair. The endpoints in a pair specify a minimum and maximum channel value for each channel. A partition index that is included in the compressed format specifies a mask for each pair of endpoint values to provide higher quality compression for blocks with more pixel variation that can be represented using a single linear interpolation computation. The mask indicates which endpoint pair should be used to compute channel values for each pixel.

Indices are specified for each channel of each pixel and are used to compute the channel value by linearly interpolating between the endpoint channel values. Specifically, the channel values are computed using linear interpolation, as shown in equation 1:

$$Pixel_c = Endpoint0_c + (((Endpoint1_c - Endpoint0_c) * weight[index]) >> shift), \quad (eq. 1)$$

where c corresponds to each channel, e.g., red, green, blue, or the like, and shift is 6 and the index is 3 bits. Weight values for increasing index values are 0, 9, 18, 27, 37, 46, 55, and 64. Each pixel may be one of 16 possible colors (2 regions, each with 8 possible index values). $Endpoint0_c$, $Endpoint1_c$, $Endpoint2_c$, and $Endpoint3_c$ are each 8 bit values which are dequantized from the values stored in the compression format. $Endpoint0_c$ and $Endpoint1_c$ are used to compute decompressed channel values for pixels in the first region and $Endpoint2_c$ and $Endpoint3_c$ are used to compute decompressed channel values for pixels in the second region. In some embodiments of the present invention, there are 32 possible two-region partitionings.

In the process of compressing the image, the compressor generates full-precision 8 bit vales for the endpoints. In order to fit these endpoints in the space available in the format, they are quantized into fewer bits. Conceptually, the quantized values are bins, with each bin representing a range of unquantized values. When the quantized values are dequantized, it is assumed that each bin represents a number of unquantized values that is as equal as possible. Since equation 1 uses dequantized values, it is important that the entire range of valid values can be produced. Therefore, the extreme bins (1 and $2^i-1$, where i is the quantization precision) are dequantized to the limits of the full-precision range.

Specifically, 8 bit quantized values are simply output as the dequantized values. Quantized values of 0 are output as dequantized values of 0, the minimum of the full-precision range. Quantized values of $2^i-1$ are output as the maximum dequantized value of $2^8-1$ (or 0xff), the maximum limit of the full-precision range. Dequantized channel values between 0 and $2^i-1$ are computed, as shown in equation 2:

$$dequantized_c = (q_c * 256 + 128) >> i, \quad (eq. 2)$$

where $q_c$ corresponds to a quantized channel value and i is the precision (8 bits). Note that multiplication by 256 is simply a binary shift operation and summing with 128 is the equivalent of a logical OR of 0x80 to the shifted value. Additionally, since the value of i is known, the second shift can be combined with the first one, so the circuitry for dequantization is simple and compact. In an alternate embodiment of the present invention, 128 is replaced with 127 in equation 2.

Figure 1B:
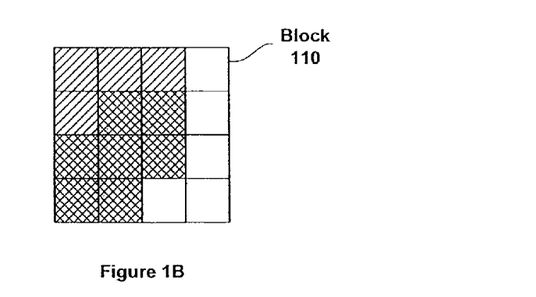
FIG. 1B illustrates a three partition distribution of the fixed size block of pixels in accordance with one or more aspects of the present invention.

FIG. 1B illustrates a three partition distribution of the fixed size block 110 of pixels in accordance with one or more aspects of the present invention. The pixels within block 100 are distributed into three different regions, where each region is represented with a different pattern. Each region corresponds to one endpoint pair and the endpoint values for three endpoint pairs are specified with less accuracy than for the two endpoint pair encoding. Each pixel may be one of 24 possible colors (3 regions, each with 8 possible index values). The low dynamic range channel values are compressed for each region using equation 1, where $Endpoint4_c$ and $Endpoint5_c$ are used to compute decompressed channel values for pixels in the third region. In some embodiments of the present invention, there are 16 possible three-region partitionings.

Different blocks within a single image may use different numbers of partitions and different endpoint compression formats (specified by the mode bits), varying the number of compressed endpoint values (four or six), the number of bits stored for each endpoint (and each channel of the endpoints), and storing the compressed endpoints as differences. The compression scheme has a compression size of 8 bpp and, there are 160 possible different format variations.

Figure 1C:
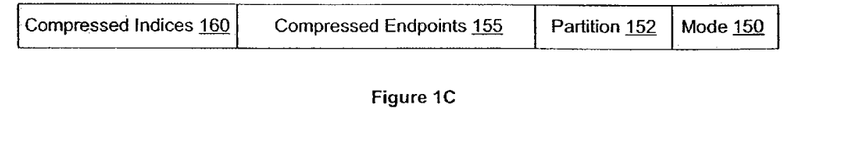
FIG. 1C illustrates data fields of the low dynamic range 3-channel compression format in accordance with one or more aspects of the present invention.

FIG. 1C illustrates data fields of the low dynamic range 3-channel compression format, in accordance with one or more aspects of the present invention. A fixed size block, e.g., 4×4, of low dynamic range pixels is compressed into a 128 bit format. The 128 bit format represents 16 pixels with three 8 bit channels, i.e., 384 bits of data. The different fields of the compression format have varying bit lengths dependent on which variation of the format is used to represent the compressed low dynamic range data. A first field of the compression format, compressed indices 160 occupies either 45 or 46 bits of the 128 bit compressed fixed size block. The compressed indices are decompressed to produce a 3 bit index for each pixel within the fixed size block. A second field of the compression format, compressed endpoints 155 occupies 74-76 bits of the 128 bit compressed fixed size block. Depending on the format variation, there may be 4 or 6 endpoint values encoded in compressed endpoints 155.

Figure 1D:
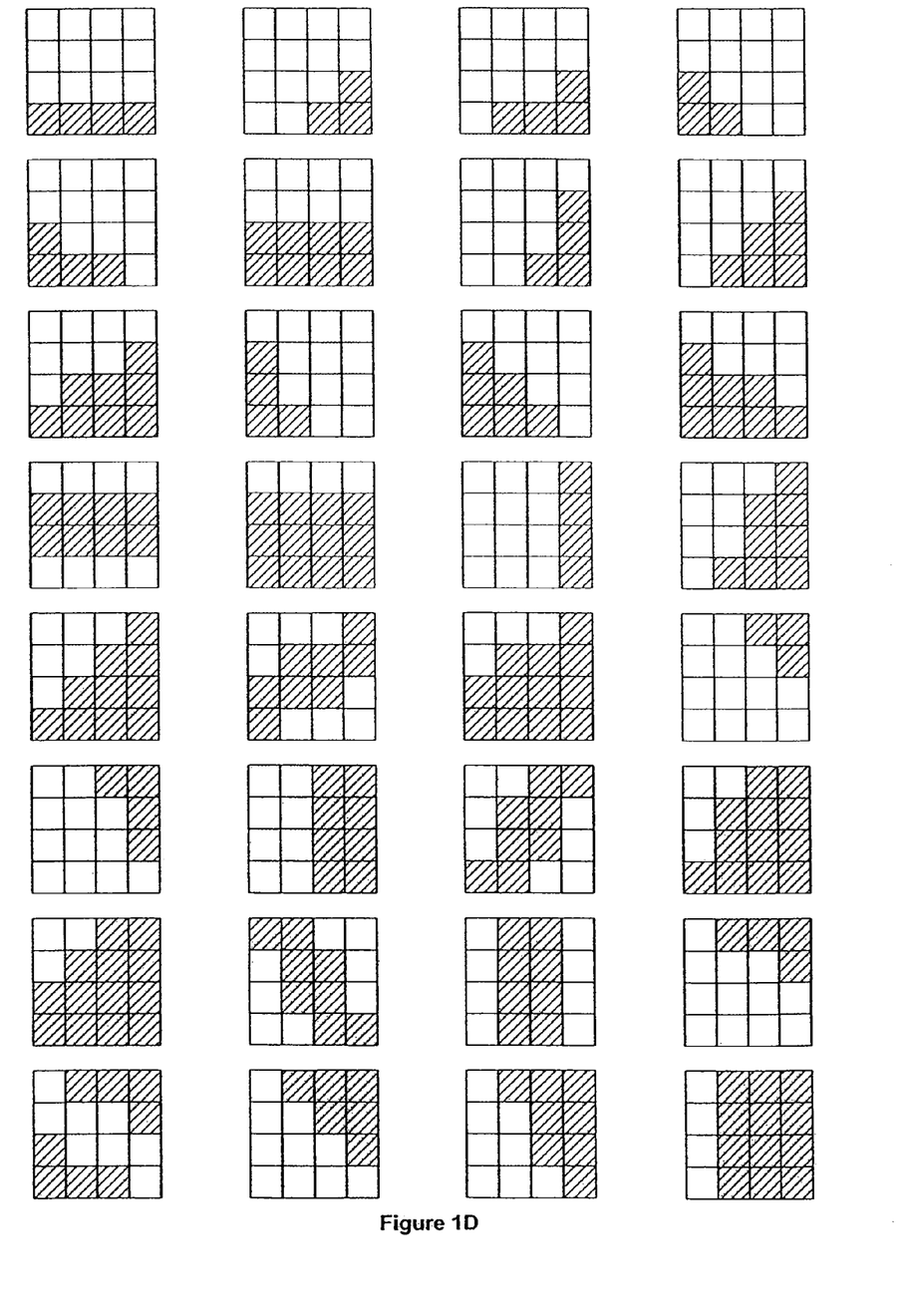
FIG. 1D illustrates the different two partition distributions of the fixed size block of pixels in accordance with one or more aspects of the present invention.
Figure 1E:
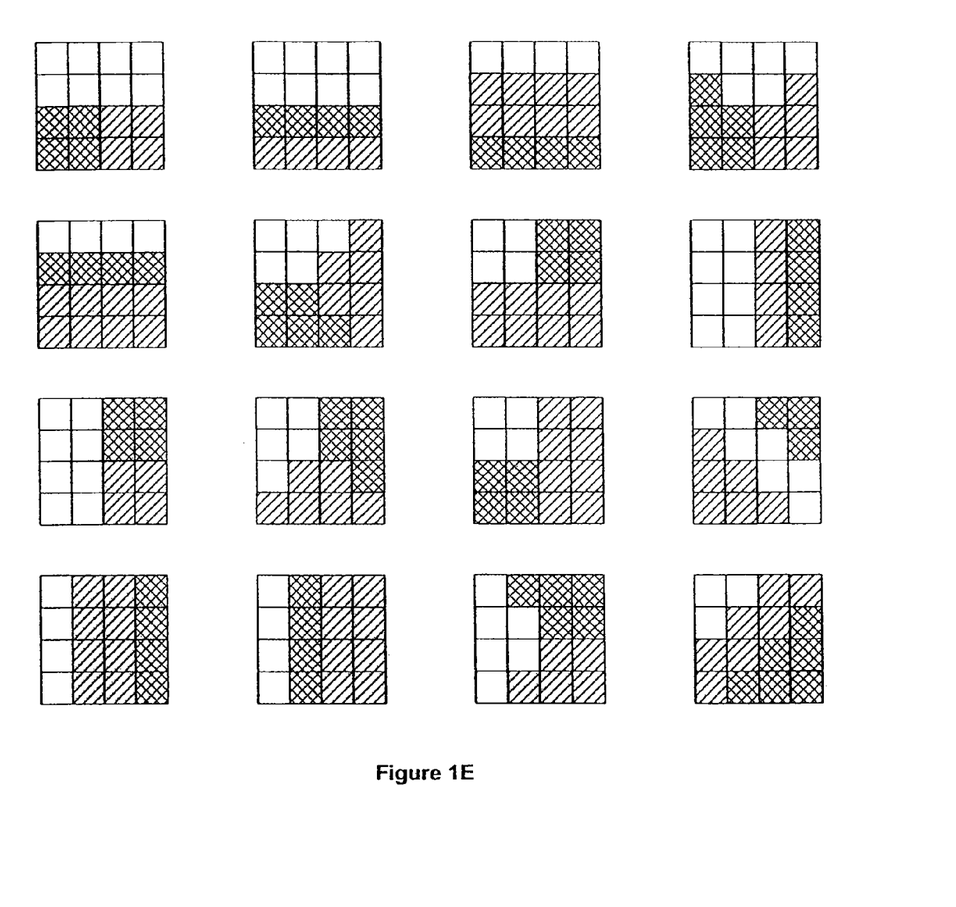
FIG. 1E illustrates the different three partition distributions of the fixed size block of pixels in accordance with one or more aspects of the present invention.

A third field of the compression format includes partition 152 that occupies 4 or 5 bits. When three regions are used partition 152 is 4 bits and when two regions are used partition 152 is 5 bits. FIG. 1D illustrates the 32 different two partition distributions of the fixed size block of pixels, in accordance with one or more aspects of the present invention. FIG. 1E illustrates the 16 different three partition distributions of the fixed size block of pixels, in accordance with one or more aspects of the present invention.

Finally, a fourth field of the compression format includes a variable length code, mode 150 that selects between six possible variations of the compression format. The mode bits specify the type of endpoint compression, e.g., none, four point transform, six point transform, and the number of bits used for the endpoint values. TABLE 1 illustrates the compression format variations that are specified by the mode bits, for one embodiment of the present invention.

TABLE 1

| Mode | Endpoint differences | Endpoint bits | partitions | Index bits |
|---|---|---|---|---|
| 000 | yes (555) | 76 | 3 | 45 |
| 100 | no | 76 | 3 | 45 |
| 01 | yes (888) | 75 | 2 | 46 |
| 010 | yes (787) | 74 | 2 | 46 |
| 110 | no | 74 | 2 | 46 |
| 11 | yes (777) | 75 | 2 | 46 |

The lsb of the mode bits specify whether there are two or three mode bits. When the lsb is one, there are only two mode bits. When mode 000 is used, there are 5 bits stored for each channel of the six endpoint values. The 18 channel 5 bits channel values (90 bits) are compressed into 76 bits (endpoint bits in the third column of TABLE 1). The reference endpoint is stored as a 555 (5 bits of red, 5 bits of green, and 5 bits of blue) value. The channel values for the remaining five compressed endpoints are stored as signed 444 difference values, with the exception of one compressed endpoint that is stored as a signed 454 difference value. Since the number of endpoints is six, the number of partitions is three and there are 45 bits of compressed indices.

When mode 100 is used, each channel of the six endpoint values is specified directly as an unsigned value rather than as a single reference endpoint and differences. Specifically, four of the six endpoint values are stored as 454 values and the remaining two endpoint values are stored as 444 values. Since the number of endpoints is six, the number of partitions is three and there are 45 bits of compressed indices.

When mode 01 is used, a single reference endpoint is specified with channel difference values for the remaining three endpoints. Four 24 bit endpoint values (96 bits) are compressed into 75 bits. The reference endpoint is stored as an 888 value. The channel values for the two of the remaining compressed endpoints are stored as signed 666 difference values and the fourth compressed endpoint that is stored as a signed 555 value. Since the number of endpoints is four, the number of partitions is two and there are 46 bits of compressed indices.

When mode 010 is used, each channel of four endpoint values is specified directly as an unsigned value rather than as a single reference endpoint and differences. The four 787 (22 bit) endpoint values (88 bits) are compressed into 74 bits. The reference endpoint is stored as a 787 value. The channel values for the two of the remaining compressed endpoints are stored as signed 666 difference values and the fourth compressed endpoint is stored as a signed 565 value. Since the number of endpoints is four, the number of partitions is two and there are 46 bits of compressed indices.

When mode 110 is used, a single reference endpoint is specified with channel difference values for the remaining three endpoints. Specifically, two of the four endpoint values are stored as 676 values and the remaining two endpoint values are stored as 666 values. Since the number of endpoints is four, the number of partitions is two and there are 46 bits of compressed indices.

When mode 11 is used, a single reference endpoint is specified with channel difference values for the remaining three endpoints. Four 24 bit endpoint values (96 bits) are compressed into 75 bits. The reference endpoint is stored as a 777 value. The channel values for the remaining compressed endpoints are stored as signed 666 difference values. Since the number of endpoints is four, the number of partitions is two and there are 46 bits of compressed indices. In other embodiments of the present invention, different numbers of bits may be used to represent the endpoints and different combinations of partitioning and endpoint compression may be used to represent the compressed low dynamic range data. Note that the partitions are sorted so that the endpoints with the greatest resolution in term of number of bits tend to correspond to the region with the greatest number of pixels.

Figure 2:
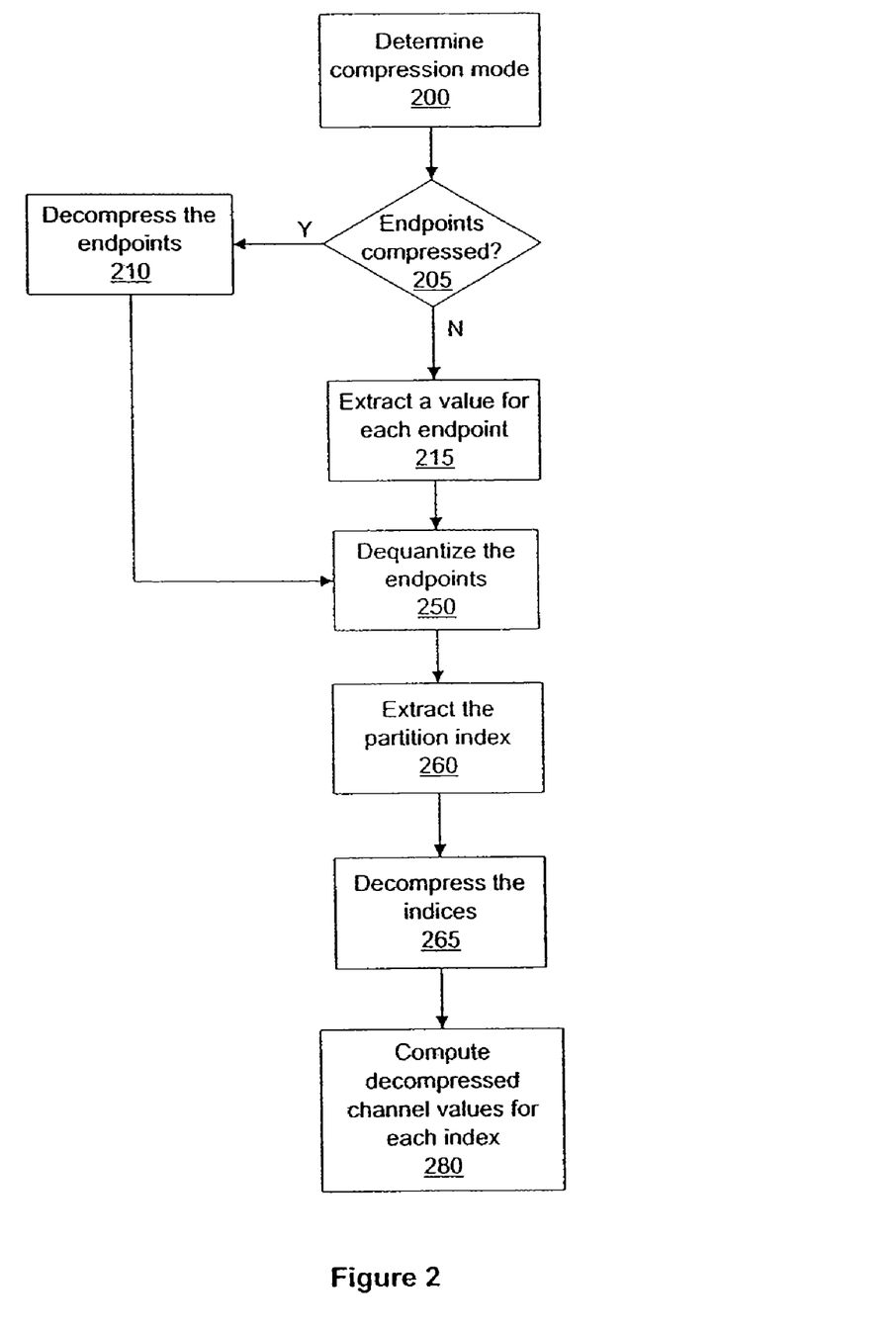
FIG. 2 illustrates a flow diagram of an exemplary method of decompressing data represented in the format shown in FIG. 1C in accordance with one or more aspects of the present invention.

FIG. 2 illustrates a flow diagram of an exemplary method of decompressing data represented in the format shown in FIG. 1C, in accordance with one or more aspects of the present invention. In step 200 the method determines the compression mode that is specified by the mode bits. In step 205 the method determines if the endpoint pair is encoded using difference encoding.

If, in step 205 the method determines that difference encoding is not specified by the compression mode, then in step 215 the method extracts values for four or six endpoints. The channel values for the four or six endpoints that are less than 8 bits are dequantized to produce 8 bit unsigned channel values. Otherwise, in step 210 the method decompresses the endpoints. When the difference encoding modes are used, one reference endpoint is directly specified and the remaining endpoints are computed by sign extending the compressed endpoint value (difference) for each channel and summing it with the corresponding channel of the reference endpoint or another decompressed endpoint, as described in conjunction with FIG. 3A. Each of the six channel values for the decompressed endpoints are 5 to 8 bit signed or unsigned values. In step 250 the method dequantizes the channel values for endpoint0, endpoint1, endpoint2, and endpoint3, and endpoint4 and endpoint5 when 6 endpoints are used, to produce unsigned 8 bit unsigned channel values for all six endpoints. The quantized channel values are dequantized using previously described equation 2.

The decompressed endpoints are then used to compute low dynamic range values for each pixel of a block. In step 260 the method extracts the 4 or 5 bit partition index from the compressed format and determines the partition mask for the block. In step 265 the method uses the mode and partition to decompress the indices to produce a 3 bit index for each pixel of the block, as described in detail in conjunction with FIG. 3D. Each index is 3 bits, in order to specify 8 different sample points between a pair of endpoints. In step 280 the method computes a decompressed value for each pixel using the decompressed indices, the partition mask, and the decompressed endpoint values. Specifically, the partition mask bit for each pixel is used to select which pair of the dual endpoint pairs to use in the linear interpolation (eq. 1) in order to compute the channel values for the pixel. The partition mask includes one of two values for each pixel when two regions are used and one of three values for each pixel when three regions are used.

Figure 3A:
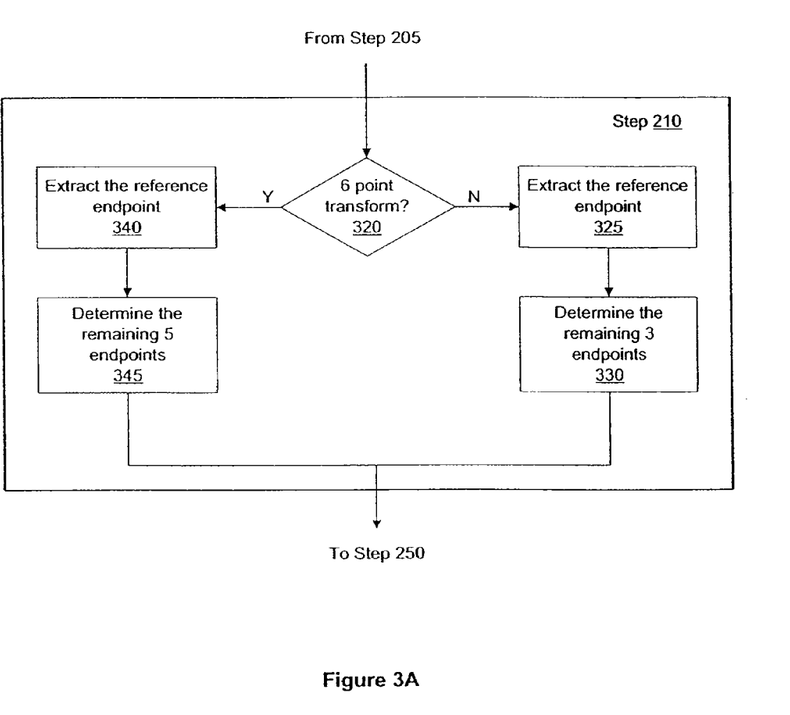
FIG. 3A illustrates a flow diagram of an exemplary method of performing a step shown in FIG. 2 in accordance with one or more aspects of the present invention.

FIG. 3A illustrates a flow diagram of an exemplary method of performing step 210 of FIG. 2 to decompress the endpoint values, in accordance with one or more aspects of the present invention. In step 320 the method determines if the compression mode that is specified by the mode bits is a six (end)point transform. If, in step 320 the method determines that a six point transform is used, then in step 340 the method extracts the reference endpoint.

Figure 3B:
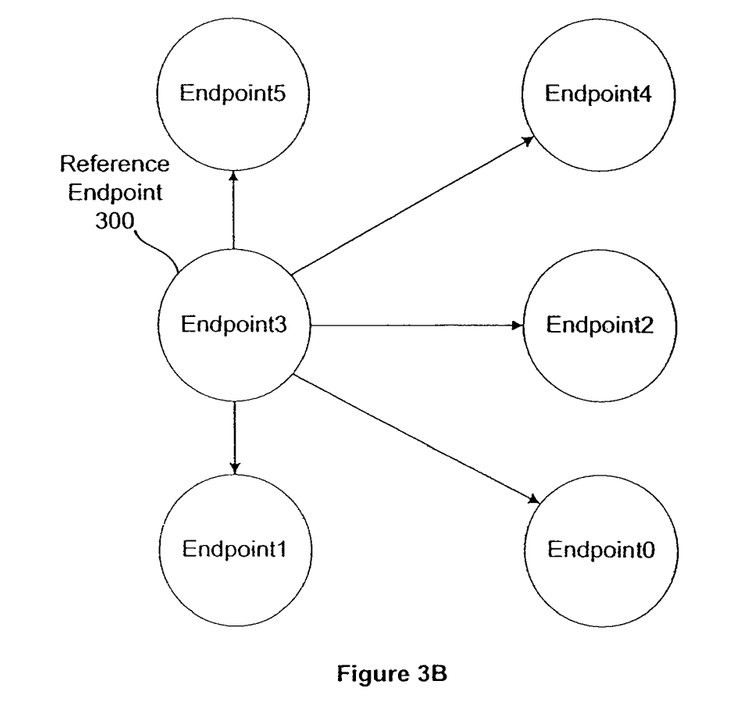
FIG. 3B is a conceptual diagram of the six point transform used to decompress the compressed endpoints in accordance with one or more aspects of the present invention.

FIG. 3B is a conceptual diagram of the six point transform used to decompress the compressed endpoints, in accordance with one or more aspects of the present invention. Endpoint3 is reference endpoint 300. In other embodiments of the present invention, any one of the other endpoints is the reference endpoint. In step 345 the method computes the channel values for endpoint0, endpoint1, endpoint2, endpoint4, and endpoint5. When endpoint differences are not used, in step 345 the method simply extracts the values for endpoint0, endpoint1, endpoint2, endpoint4, and endpoint5 from the compressed format. When endpoint differences are used, in step 345 the method sums the channel difference values for endpoint0, endpoint1, endpoint2, endpoint4, and endpoint5 with the channel values for reference endpoint 300 to compute the decompressed channel values for endpoint0, endpoint1, endpoint2, endpoint4, and endpoint5 and proceeds to step 250. Note that when endpoint differences are used, the values for non-reference endpoints are actually signed values and thus need to be sign-extended before being added to the reference endpoint or another decompressed endpoint.

Figure 3C:
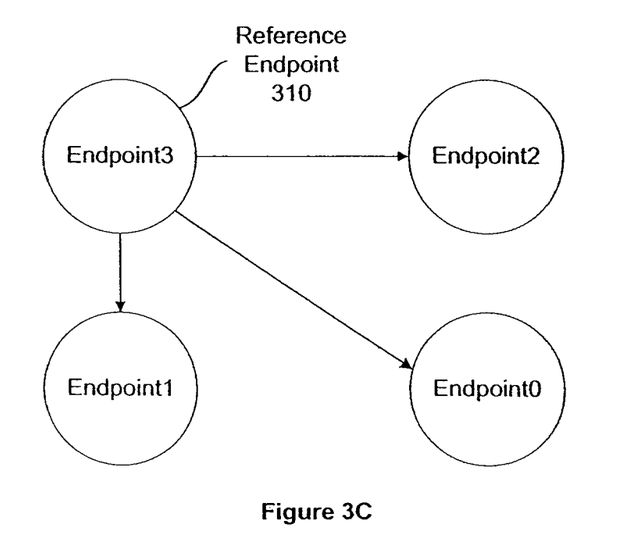
FIG. 3C is a conceptual diagram of the four point transform used to decompress the compressed endpoints in accordance with one or more aspects of the present invention.

If, in step 320 the method determines that a six point transform is not used, then in step 325 the method extracts the reference endpoint for the four point transform. FIG. 3C is a conceptual diagram of the four point transform used to decompress the compressed endpoints, in accordance with one or more aspects of the present invention. Endpoint3 is reference endpoint 310. In step 325 the method computes the channel values for endpoint0, endpoint1, and endpoint2. When endpoint differences are not used, in step 325 the method simply extracts the values for endpoint0, endpoint1, and endpoint2 from the compressed format. When endpoint differences are used, in step 330 the method sums the channel difference values for endpoint0, endpoint1, and endpoint2 with the channel values for reference endpoint 310 to compute the decompressed channel values for endpoint0, endpoint1, and endpoint2 and proceeds to step 250. In other embodiments of the present invention, endpoint0 is encoded as a difference relative to endpoint1 or endpoint2 instead of a difference relative to endpoint3.

Figure 3D:
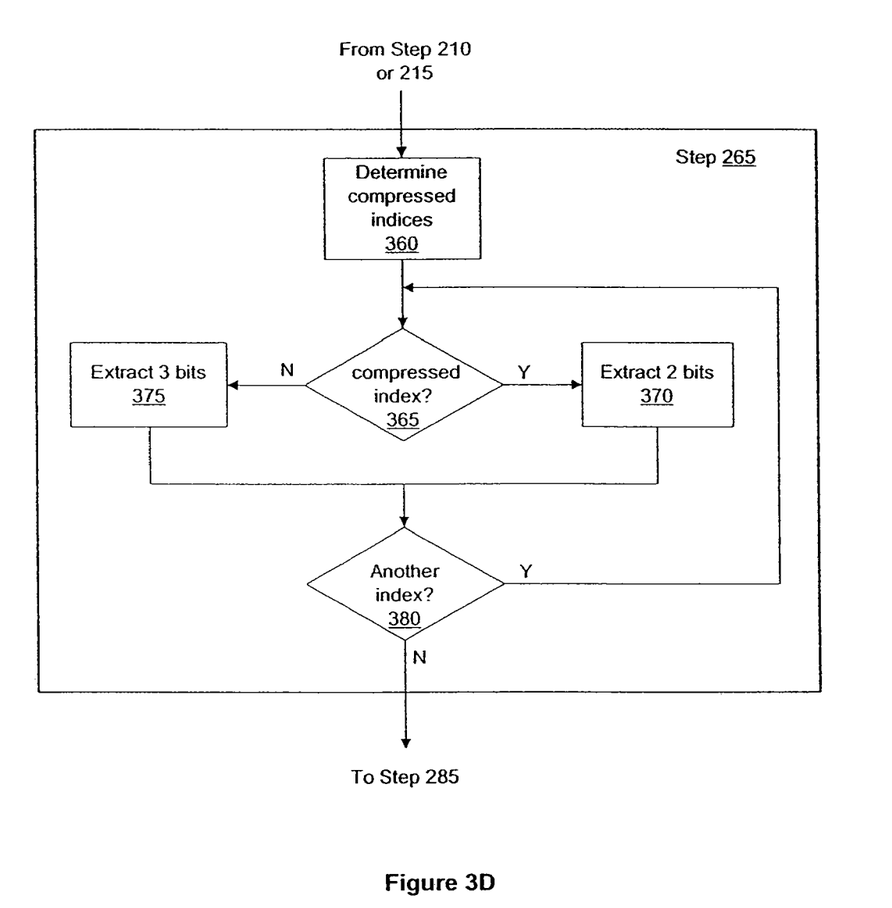
FIG. 3D illustrates a flow diagram of an exemplary method of performing another step shown in FIG. 2 in accordance with one or more aspects of the present invention.

FIG. 3D illustrates a flow diagram of an exemplary method of performing step 265 of FIG. 2, in accordance with one or more aspects of the present invention. In step 360 the method determines which of indices of compressed indices 160 are compressed. In some embodiments of the present invention, one index for each endpoint pair has an msb (most significant bit) of zero, and therefore only 2 of the 3 bits are stored. The indices can be compressed since the compressor changes the ordering of the endpoints to ensure that the msb of one index (per endpoint pair) is zero, and thus does not need to be stored. TABLE 2 shows which indices are compressed for each partition index based on the partition mask when two partitions are used to compress the low dynamic range data. For example, when the partition index is a value 6 index 0 has an msb of zero for the first partition and index 15 has an msb of zero for the second partition.

TABLE 2

| Partition index[4:0] | Compressed indices |
|---|---|
| 0, 1, 2, 5, 6, 7, 8, 11, 13, 14, 15, 16, 18, 21, 23, 24, 30, 31 | 0, 15 |
| 3, 4, 9, 10, 12, 17, 25, 28 | 0, 8 |
| 19, 20, 22, 26, 27, 29 | 0, 2 |

TABLE 3 shows which indices are compressed for each partition index based on the partition mask when three partitions are used to compress the low dynamic range data. For example, when the partition index is a value 6 index 0 has an msb of zero for the first partition, index 15 has an msb of zero for the second partition, and index 9 has an msb of zero for the third partition.

TABLE 3

| Partition index[3:0] | Compressed indices |
|---|---|
| 0, 1, 3, 5, 6, 13 | 0, 15, 9 |
| 2, 15 | 0, 5, 15 |
| 4, 7, 8, 9, 10, 11, 12, 14 | 0, 14, 7 |

In step 365 the method determines if the index for a first compressed channel value is the compressed index, and, if so, then 2 bits are extracted from compressed indices 160. Otherwise, in step 375 the method extracts 3 bits for the index. In step 380 the method determines if another index is included in compressed indices 160, and, if so, the method returns to step 365. Otherwise, all of the indices are decompressed and the method proceeds to step 285.

Figure 4A:
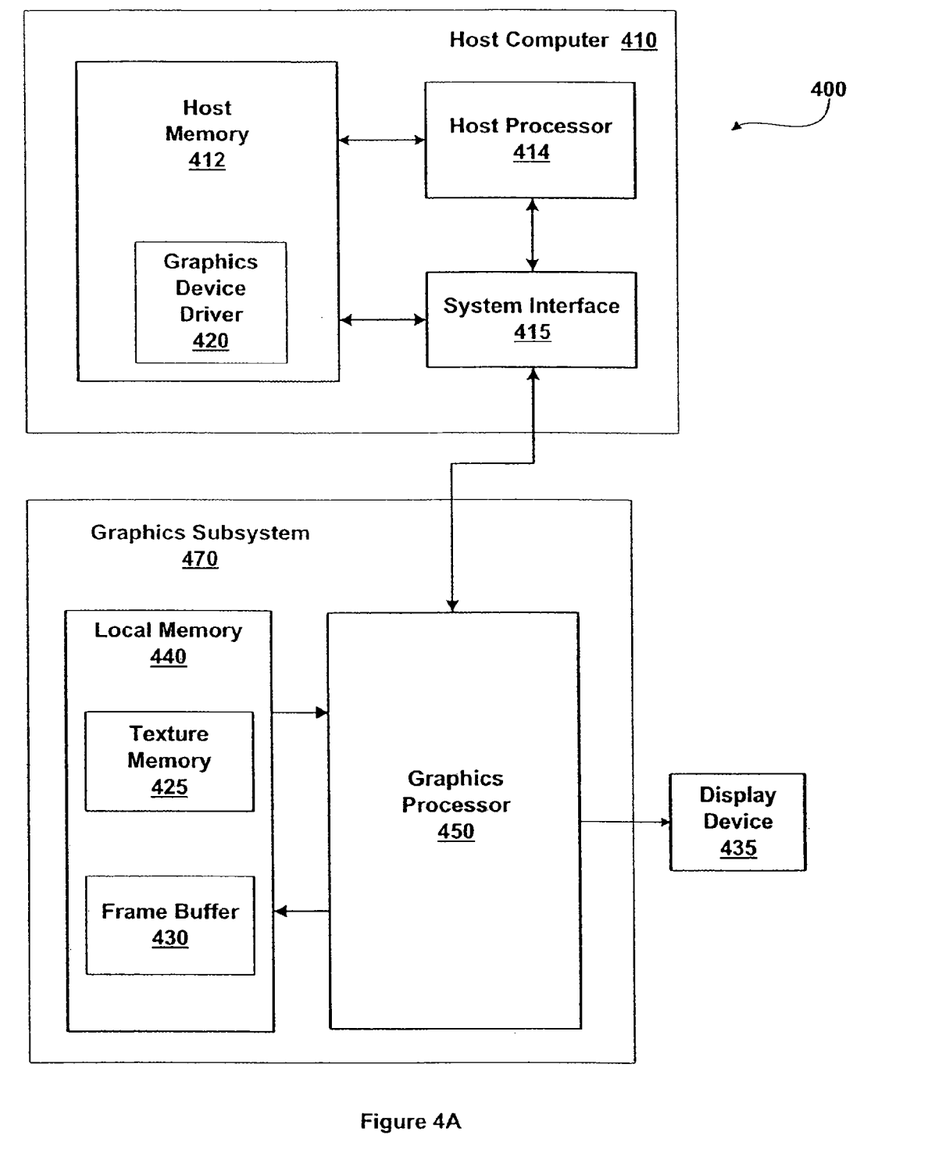
FIG. 4A is a block diagram of a graphics processing system in accordance with one or more aspects of the present invention.

FIG. 4A illustrates one embodiment of a computing system 400 including a host computer 410 and a graphics subsystem 470, in accordance with one embodiment of the present invention. Computing system 400 may be a desktop computer, server, laptop computer, palm-sized computer, tablet computer, game console, cellular telephone, computer based simulator, or the like. Host computer 410 includes host processor 414 that may include a system memory controller to interface directly to host memory 412 or may communicate with host memory 412 through a system interface 415. System interface 415 may be an I/O (input/output) interface or a bridge device including the system memory controller to interface directly to host memory 412.

A graphics device driver 420 is stored in host memory 412 and is configured to interface between applications and a graphics subsystem 470. Graphics device driver 420 translates instructions for execution by graphics processor 450 based on the specific capabilities of graphics processor 450. In some embodiments of the present invention, graphics device driver 420 is configured to compress low dynamic range data into the single endpoint compressed format or the dual endpoint compressed format for use by graphics processor 450. Storing the low dynamic range data in a compressed format reduces the amount of memory needed to store the data and reduces the bandwidth needed to read the data. Graphics device driver 420 may store the compressed low dynamic range data in texture memory 225 for processing by graphics processor 450.

Host computer 410 communicates with graphics subsystem 470 via system interface 415. Data received by graphics processor 450 can be processed by a graphics pipeline within graphics processor 450 or written to a local memory 440. Graphics processor 450 uses graphics memory to store graphics data and program instructions, where graphics data is any data that is input to or output from units within graphics processor 450. Graphics memory can include portions of host memory 412, local memory 440, register files coupled to the components within graphics processor 450, and the like. Graphics processor 450 includes one or more processing units that may each read and/or write graphics memory. In alternate embodiments, host processor 414, graphics processor 450, system interface 415, or any combination thereof, may be integrated into a single processing unit. Further, the functionality of graphics processor 450 may be included in a chip set or in some other type of special purpose processing unit or co-processor.

In a typical implementation graphics processor 450 performs geometry computations, rasterization, pixel texture mapping and shading computations and raster operations. Texture maps, including compressed low dynamic range data are stored in texture memory 225 within local memory 440. The compressed low dynamic range data represented in the compressed format may be read and decoded by graphics processor 450 for use during the execution of graphics processing programs. Specifically, the compressed low dynamic range data may be used during the processing of geometry, vertex, or pixel data.

When the data received by graphics subsystem 470, including decompressed low dynamic range data, has been completely processed by graphics processor 450, processed graphics data is output to a frame buffer 430 within local memory 440. In some embodiments of the present invention, graphics processor 450 is optionally configured to deliver data to a display device 435, network, electronic control system, other computing system 400, other graphics subsystem 470, or the like. Alternatively, data is output to a film recording device or written to a peripheral device, e.g., disk drive, tape, compact disk, or the like.

Figure 4B:
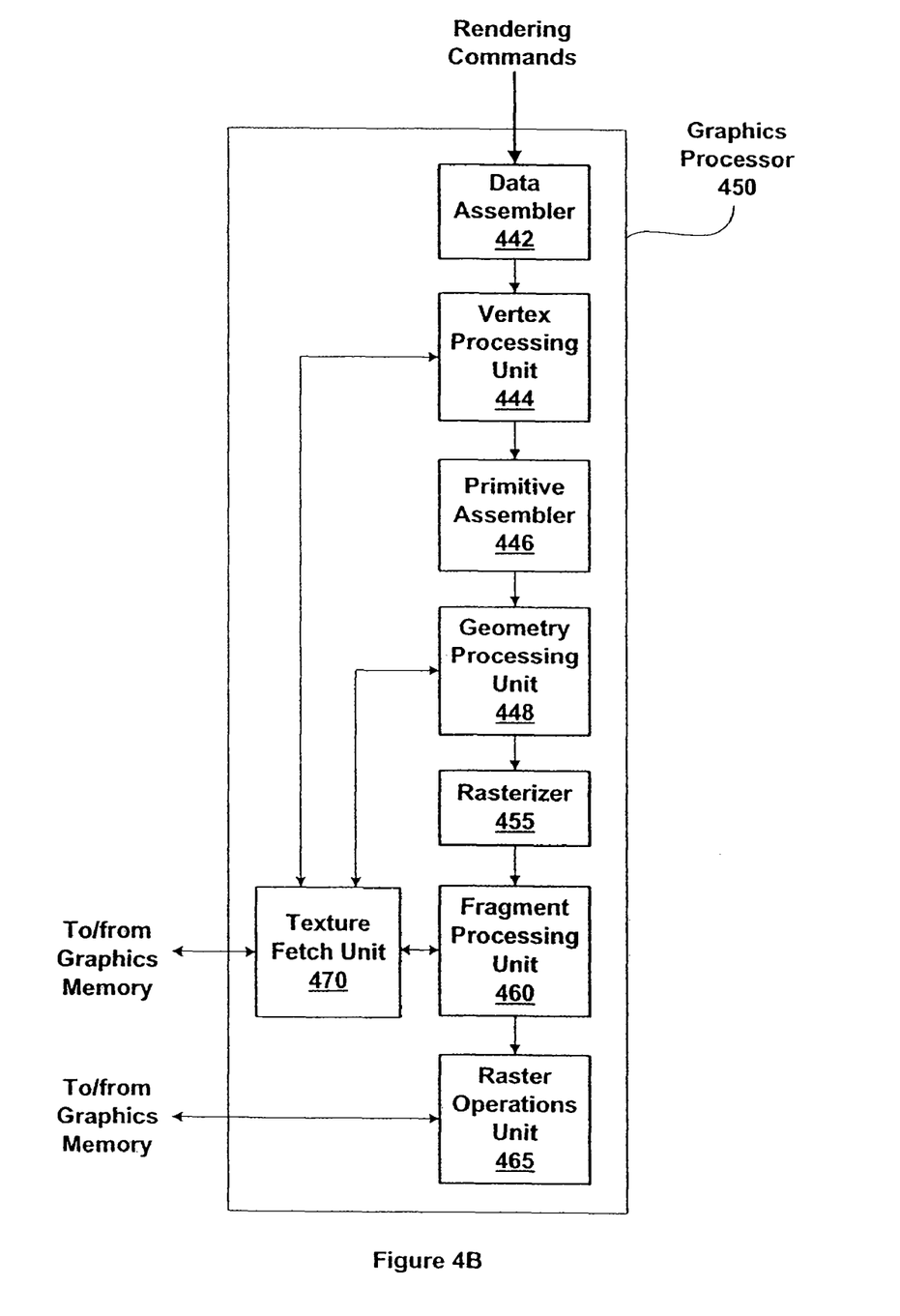
FIG. 4B illustrates the graphics processor of FIG. 4A in accordance with one or more aspects of the present invention.

FIG. 4B illustrates graphics processor 450 of FIG. 4A, in accordance with one or more aspects of the present invention. Graphics processor 450 includes a data assembler 442, vertex processing unit 444, a primitive assembler 446, geometry processing unit 448, a rasterizer 455, fragment processing unit 460, and a raster operations unit 465. Data assembler 442 is a fixed function unit that collects vertex data for high-order surfaces, primitives, and the like, and outputs the vertex data to vertex processing unit 444. Vertex processing unit 444 is a programmable execution unit that is configured to execute vertex shader programs, transforming vertex data as specified by the vertex shader programs. For example, vertex processing unit 444 may be programmed to transform the vertex data from an object-based coordinate representation (object space) to an alternatively based coordinate system such as world space or normalized device coordinates (NDC) space. Vertex processing unit 444 may read compressed low dynamic range data that is stored in local memory 440 through texture fetch unit 470 for use in processing the vertex data.

Primitive assembler 446 receives processed vertex data from vertex processing unit 444 and constructs graphics primitives, e.g., points, lines, triangles, or the like, for processing by geometry processing unit 448. Geometry processing unit 448 is a programmable execution unit that is configured to execute geometry shader programs, transforming graphics primitives received from primitive assembler 446 as specified by the geometry shader programs. For example, geometry processing unit 448 may be programmed to subdivide the graphics primitives into one or more new graphics primitives and calculate parameters, such as plane equation coefficients, that are used to rasterize the new graphics primitives. Geometry processing unit 448 outputs the parameters and new graphics primitives to rasterizer 455. Geometry processing unit 448 may read compressed low dynamic range data that is stored in local memory 440 through texture fetch unit 470 for use in processing the geometry data.

Rasterizer 455 scan converts the new graphics primitives and outputs fragments and coverage data to fragment processing unit 460. Fragment processing unit 460 is a programmable execution unit that is configured to execute fragment shader programs, transforming fragments received from rasterizer 455 as specified by the fragment shader programs. For example, Fragment processing unit 460 may be programmed to perform operations such as perspective correction, texture mapping, shading, blending, and the like, to produce shaded fragments that are output to raster operations unit 465. Fragment processing unit 460 may read compressed low dynamic range data that is stored in local memory 440 through texture fetch unit 470 for use in processing the fragment data. Texture fetch unit 470 produces read requests for compressed low dynamic range data stored as texels, decompresses the compressed low dynamic range data, and performs texture filtering operations, e.g., bilinear, trilinear, anisotropic, and the like, as described in conjunction with FIG. 5A. Raster operations unit 465 is a fixed function unit that optionally performs near and far plane clipping and raster operations, such as stencil, z test, and the like, and outputs pixel data as processed graphics data for storage in graphics memory. The processed graphics data may be stored in frame buffer 430 for display on display device 435.

Figure 5A:
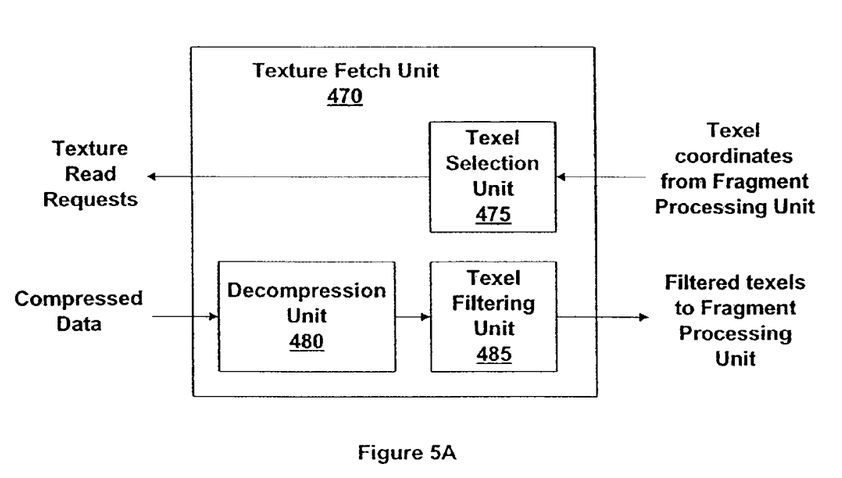
FIG. 5A illustrates the texture fetch unit of FIG. 4B in accordance with one or more aspects of the present invention.

FIG. 5A illustrates texture fetch unit 470 of FIG. 4B, in accordance with one or more aspects of the present invention. Texture fetch unit 470 includes a texel selection unit 475, a decompression unit 480, and a texture filtering unit 485. Texture selection unit 475 determines which texels should be read based on the texture map coordinates and computes the addresses for read requests. Decompression unit 480 receives the compressed low dynamic range data and decompressed the compressed low dynamic range data to produce decompressed low dynamic range values.

Texture filtering unit 485 receives the decompressed low dynamic range values and performs point sampling, bilinear filtering, trilinear filtering, or anisotropic filtering to produce filtered texel values that are output to fragment processing unit 460. Texture filtering unit 485 is configured to interpret the decompressed low dynamic range values as values represented in a fixed point format. In some embodiments of the present invention, texture filtering unit 485 is configured to perform the conversion operations to convert fixed point values into floating point format values. In some embodiments of the present invention additional texture fetch units 470 are coupled to other processing units within graphics processor 450, such as vertex processing unit 444 and geometry processing unit 448 to allow those units to obtain decompressed low dynamic range values for processing.

Figure 5B:
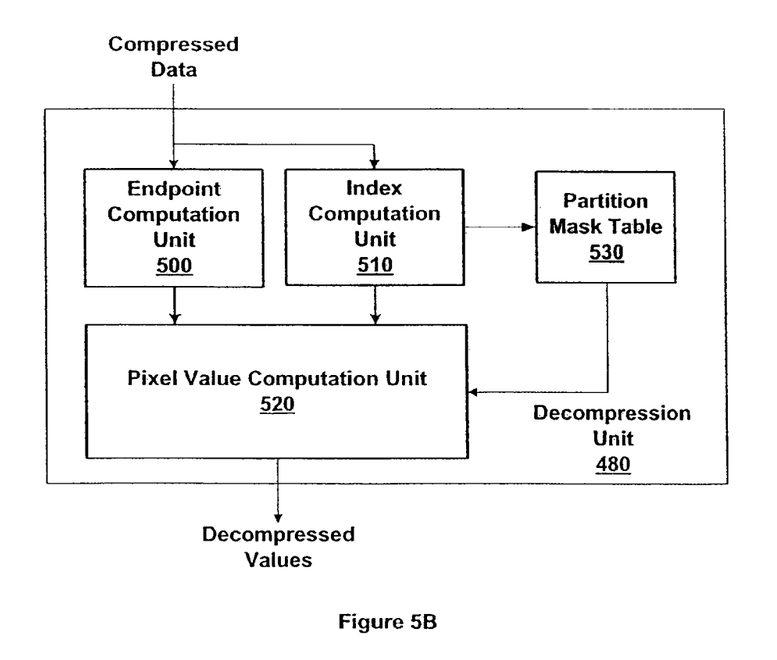
FIG. 5B is a block diagram of the decompression unit of FIG. 5A in accordance with one or more aspects of the present invention.

FIG. 5B is a block diagram of decompression unit 480, in accordance with one or more aspects of the present invention. Decompression unit 480 includes an endpoint computation unit 500, an index computation unit 510, a pixel computation unit 520, and a partition mask table 530. Endpoint computation unit 500 receives the mode bits and the compressed low dynamic range data including four or six compressed endpoints and performs steps 210 and 250 of FIGS. 2 and 3A. Endpoint computation unit 500 is configured to decode compressed endpoints 155 based on mode 150 for the various compressed formats shown in TABLE 1. Endpoint computation unit 500 outputs 8 bit per channel dequantized (and decompressed) integer endpoints (four or six) and the mode bits to pixel computation unit 520.

Index computation unit 510 receives the mode bits, the partition index, and the compressed indices and performs steps 260 and 265 of FIGS. 2 and 3D. Partition mask table 530 stores the partition masks specified by the partition index as shown in FIGS. 1D and 1E. Index computation unit 510 is configured to decompress compressed indices 160 based on mode 150, partition index 152, and the partition mask using the information shown in TABLES 2 and 3. Index computation unit 510 outputs decompressed indices and the partition mask to pixel computation unit 520. Pixel value computation unit 520 performs step 280 of FIG. 2 to compute decompressed low dynamic range channel values for each pixel.

Figure 6:
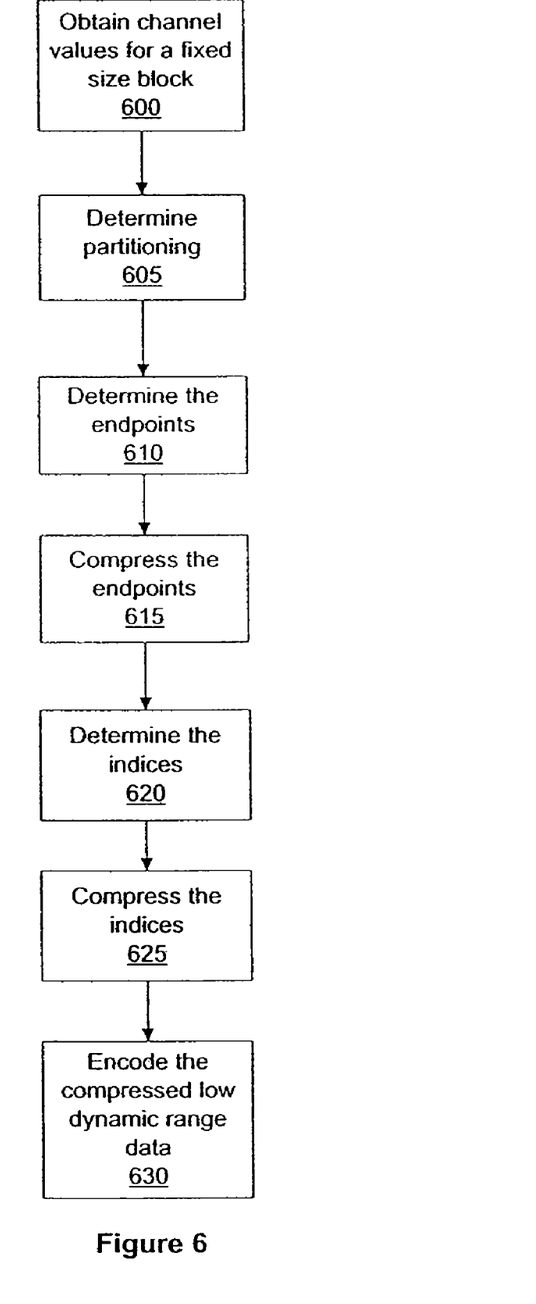
FIG. 6 illustrates a flow diagram of an exemplary method of compressing low dynamic range data into the format shown in FIG. 1C in accordance with one or more aspects of the present invention.

FIG. 6 illustrates a flow diagram of an exemplary method of compressing low dynamic range data into the format shown in FIG. 1C, in accordance with one or more aspects of the present invention. In step 600 the method obtains channel values for pixels in the fixed size block. In step 605 the method determines the partitioning for the fixed size block, e.g., two or three regions and the partition index, using techniques known to those skilled in the art. In step 610 the method determines the endpoints for each region. In step 615 the method compresses the endpoints to match a variation of the format shown in TABLE 1. Specifically, the compressor tries each possible endpoint compression format, looking for a result with differences that match the number of bits available in a format. During this process, the endpoints are quantized to match the precision specified in Table 1, e.g., for mode 000 the endpoints would be quantized down from 8 bits to 5 bits prior to attempting the difference calculation. In step 620 the method determines the indices for the pixels. In step 625 the method compresses the indices based on the partition index and partition mask. In step 630 the method encodes the fixed size block by inserting the compressed indices, compressed endpoints, partition index, and mode bits into the corresponding fields of the compressed data format.

Persons skilled in the art will appreciate that any system configured to perform the method steps of FIGS. 2, 3A, 3D, or 6, or their equivalents, are within the scope of the present invention. The current invention involves new systems and methods for representing low dynamic range data in compressed formats with a fixed size block. The compression scheme has a compression rate of 8 bpp and is lossless in terms of visual quality compared with uncompressed 24 bpp low dynamic range data. The compressed low dynamic range data may be stored in less memory than low dynamic range data that is not compressed. Low dynamic range data that is encoded in the compressed format may be efficiently decompressed in hardware. Because the fixed size block of data is compressed into a fixed length format, it is possible to determine the location of each particular block of data, permitting random access of the compressed data.

Fixed size pixel blocks are compressed into 128 bits that include four or six compressed endpoint values with three channels and compressed indices for the pixels in the block. Different blocks within a single image may use different variations of the compressed format (specified by the mode bits), varying the number of compressed endpoint values (four or six) and the endpoint compression. A variable length partition index specifies a mask for each pair of the endpoint values to provide higher quality compression for blocks with more pixel variation that can be represented using a single linear interpolation computation. The indices are compressed to provide additional accuracy for the compressed endpoints.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

While the foregoing is directed to embodiments of the present invention, other and further embodiments of the invention may be devised without departing from the basic scope thereof, and the scope thereof is determined by the claims that follow.

The foregoing description and drawings are, accordingly, to be regarded in an illustrative rather than a restrictive sense. The listing of steps in method claims do not imply performing the steps in any particular order, unless explicitly stated in the claim.

All trademarks are the respective property of their owners.

The invention claimed is:

1. A method of compressing low dynamic range data into a compressed format, comprising:
    determining a partitioning of pixels into regions to produce a partition index for a fixed size block of low dynamic range data;
    determining a first reference endpoint and remaining endpoints to produce an endpoint pair for each region of the fixed size block;
    determining a variable length mode that indicates a number of bits used to represent each endpoint and a number of the regions;
    computing a second compressed endpoint, a third compressed endpoint, and a fourth compressed endpoint when the remaining endpoints are encoded as differences;
    determining compressed indices corresponding to the pixels within the fixed size block of low dynamic range data, wherein each compressed index specifies a low dynamic range value for one channel of a single pixel of the pixels; and
    encoding the variable length mode, the partition index, the compressed indices, the first reference endpoint, and the compressed endpoints to produce the low dynamic range data in the compressed format.

2. The method of claim 1, further comprising the step of computing a fifth compressed endpoint and a sixth compressed endpoint when the number of regions is three.

3. The method of claim 1, wherein the step of determining the compressed indices comprises removing a most significant bit from one index of each endpoint pair based on the partition index and the partitioning of the pixels.

4. The method of claim 1, wherein the step of computing the second compressed endpoint and the third compressed endpoint comprises subtracting the reference endpoint channel values from the second endpoint channel values and subtracting the reference endpoint channel values from the third endpoint channel values.

5. The method of claim 4, wherein the step of computing the fourth compressed endpoint comprises subtracting the reference endpoint channel values from the fourth endpoint channel values.

6. The method of claim 1, wherein the step of computing the fifth compressed endpoint and the sixth compressed endpoint comprises subtracting the reference endpoint channel values from the fifth endpoint channel values and subtracting the reference endpoint channel values from the sixth endpoint channel values.

7. The method of claim 1, wherein the partitioning of the pixels divides the pixels into two or three regions of the fixed size block.

8. The method of claim 1, wherein each channel of the low dynamic range data is quantized to a number of bits specified for each possible compressed endpoint field of variable length prior to being compressed.

9. The method of claim 1, further comprising storing the low dynamic range data represented in the compressed format in a memory.

10. A non-transitory computer-readable medium containing instructions for controlling a computer system to compress low dynamic range data into a compressed format, comprising:
   determining a partitioning of pixels in a fixed size block of low dynamic range data;
   determining a first reference endpoint and remaining endpoints to produce an endpoint pair for each partition of the fixed size block;
   determining a variable length mode that indicates a number of bits used to represent each endpoint and a number of partitions;
   computing a second compressed endpoint, a third compressed endpoint, and a fourth compressed endpoint when the remaining endpoints are encoded as differences;
   determining compressed indices corresponding to the pixels within the fixed size block of low dynamic range data, wherein each compressed index specifies a low dynamic range value for one channel of a single pixel; and
   encoding the variable length mode, the compressed indices, the first reference endpoint, and the compressed endpoints to produce the low dynamic range data in the compressed format.

11. A compressed data format representing low dynamic range data embodied in a non-transitory computer-readable medium, the compressed data format comprising:
   a first field of variable length including mode bits that indicate whether the compressed data format specifies that the low dynamic range data is encoded using a four point transform or a six point transform;
   a second field of variable length including a partition index that specifies a partition mask indicating a pair of decompressed endpoints that is used to compute a decompressed low dynamic range values for each channel of each pixel;
   a compressed endpoint field of variable length including four compressed endpoints or six compressed endpoints; and
   an index field of variable length including compressed indices that each correspond to pixels within a fixed size block of low dynamic range data, wherein each of the compressed indices is used to compute a decompressed low dynamic range value for one channel of a single pixel of the pixels.

12. The compressed data format of claim 11, wherein the endpoint compression format specifies a reference endpoint of the four compressed endpoints or the six compressed endpoints and whether remaining compressed endpoints are encoded as differences or are uncompressed.

13. The compressed data format of claim 12, wherein three compressed endpoints of the four compressed endpoints are differences relative to the reference endpoint.

14. The compressed data format of claim 12, wherein five compressed endpoints of the six compressed endpoints are differences relative to the reference endpoint.

15. The compressed data format of claim 11, wherein the endpoint compression format specifies a number of bits for each channel of the four compressed endpoints or the six compressed endpoints in the compressed endpoint field.

16. The compressed data format of claim 11, wherein a bit of a compressed index for each pair of decompressed endpoints is encoded by the mode bits and the partition mask.

17. The compressed data format of claim 11, wherein the partition mask includes an identifier for each of the pixels in the fixed size block to indicate a first portion of the pixels in the fixed size block that are compressed using a first pair of the six compressed endpoints, a second portion of the pixels in the fixed size block that are compressed using a second pair of the six compressed endpoints, and a remaining portion of the pixels in the fixed size block that are compressed using a third pair of the six compressed endpoints when the endpoint compression mode indicates that the six point transform is used to encode the low dynamic range data.

18. The compressed data format of claim 11, wherein the partition mask includes an identifier for each of the pixels in the fixed size block to indicate a first portion of the pixels in the fixed size block that are compressed using a first pair of the four compressed endpoints and a remaining portion of the pixels in the fixed size block that are compressed using a second pair of the four compressed endpoints when the endpoint compression mode indicates that the six point transform is not used to encode the low dynamic range data.

19. The compressed data format of claim 11, wherein each channel of the low dynamic range data is quantized to a number of bits specified for each possible compressed endpoint field of variable length prior to being compressed.

* * * * *